(12) United States Patent
Hamada

(10) Patent No.: US 10,510,808 B2
(45) Date of Patent: Dec. 17, 2019

(54) ORGANIC LIGHT-EMITTING STRUCTURE AND DISPLAY DEVICE

(71) Applicant: Shanghai Tianma AM-OLED Co., Ltd., Shanghai (CN)

(72) Inventor: Yuji Hamada, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 43 days.

(21) Appl. No.: 15/787,051

(22) Filed: Oct. 18, 2017

(65) Prior Publication Data

US 2018/0358417 A1    Dec. 13, 2018

(30) Foreign Application Priority Data

Jun. 13, 2017    (CN) .......................... 2017 1 0443755

(51) Int. Cl.
*H01L 27/32* (2006.01)
*H01L 51/52* (2006.01)
*H01L 51/50* (2006.01)

(52) U.S. Cl.
CPC ...... *H01L 27/3213* (2013.01); *H01L 51/5056* (2013.01); *H01L 51/5072* (2013.01); *H01L 51/5206* (2013.01); *H01L 51/5221* (2013.01)

(58) Field of Classification Search
CPC ............. H01L 27/3213; H01L 51/5056; H01L 51/5072; H01L 51/5221
USPC ...................................................... 257/40, 59
See application file for complete search history.

(56) References Cited

U.S. PATENT DOCUMENTS

| | | | |
|---|---|---|---|
| 2005/0225232 A1* | 10/2005 | Boroson | H01L 27/3213 313/504 |
| 2006/0006797 A1* | 1/2006 | Ito | G02F 1/133603 313/506 |
| 2006/0261732 A1* | 11/2006 | Miller | H01L 27/3213 313/504 |

(Continued)

FOREIGN PATENT DOCUMENTS

| | | |
|---|---|---|
| CN | 105097874 A | 11/2015 |
| CN | 106674026 A | 5/2017 |

OTHER PUBLICATIONS

Chinese Office Action for corresponding Chinese Application Serial No. 201710443755.2, dated May 7, 2018, pp. 1-22.

*Primary Examiner* — Dzung Tran
(74) *Attorney, Agent, or Firm* — Tarolli, Sundheim, Covell & Tummino LLP

(57) ABSTRACT

An organic light-emitting structure is described. The organic light-emitting structure includes a first light-emitting unit, a second light-emitting unit, a third light-emitting unit, and a fourth light-emitting unit. Each of the first light-emitting unit, the second light-emitting unit, the third light-emitting unit, and the fourth light-emitting unit comprises a first electrode, a second electrode, and an organic laminated body placed between the first electrode and the second electrode. One of the first electrode and the second electrode is a translucent electrode. At least one light-emitting unit is a fluorescent light-emitting unit. The color gamut range of the organic light-emitting structure is increased, the color saturation of the light-emitting device is improved, and quantity of colors is increased, so that the development trend of color reproducibility for the display devices can be satisfied.

14 Claims, 1 Drawing Sheet

(56) References Cited

U.S. PATENT DOCUMENTS

| | | | |
|---|---|---|---|
| 2007/0236135 A1* | 10/2007 | Fukuda | H01L 27/3213 |
| | | | 313/503 |
| 2007/0241669 A1* | 10/2007 | Liu | C09K 11/06 |
| | | | 313/504 |
| 2007/0257609 A1* | 11/2007 | Fukuda | H01L 51/5284 |
| | | | 313/506 |
| 2010/0084677 A1* | 4/2010 | Michellys | H01L 51/5262 |
| | | | 257/98 |
| 2011/0096540 A1* | 4/2011 | Oda | H01L 51/5265 |
| | | | 362/231 |
| 2016/0104749 A1 | 4/2016 | Tsuji et al. | |
| 2016/0359121 A1 | 12/2016 | Ito et al. | |

* cited by examiner

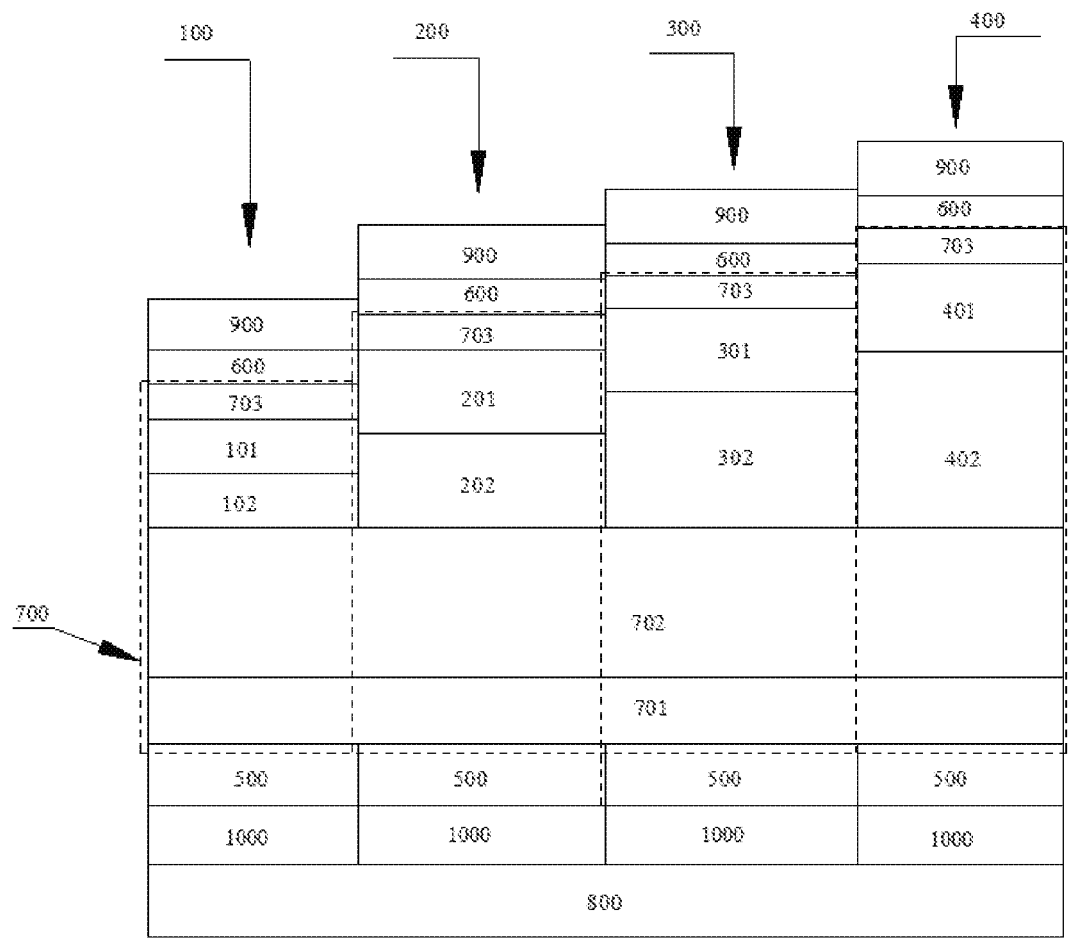

ORGANIC LIGHT-EMITTING STRUCTURE AND DISPLAY DEVICE

CROSS-REFERENCE TO RELATED APPLICATIONS

The present application claims the benefit of priority to Chinese Patent Application No. 201710443755.2, filed on Jun. 13, 2017, the content of which is incorporated herein by reference in its entirety.

TECHNICAL FIELD

The present disclosure relates to the field of display technologies and, particularly, to an organic light-emitting structure, and a display device.

BACKGROUND

An organic light-emitting diode (OLED) can be used as a light source for a display device or for a lighting device, which has advantages of wide view angle, short response time, small thickness, light weight, and ability of bending with any angles.

An OLED light emitting device may be either an active-matrix organic light emitting diode (AMOLED) or a passive-matrix organic light emitting diode (PMOLED). When compared with PMOLED, AMOLED has advantages of low energy consumption, high resolution, fast response, and other good photoelectric properties, which becomes a mainstream technology of OLED display.

Traditional AMOLED light emitting devices all consist of RGB (three primary colors), and use RGB to realize full-color images. However, a color gamut range of the three primary colors of RGB is limited, resulting in a poor color saturation and a less color quantity of the AMOLED light emitting devices, and the device cannot meet development demands on color reproducibility for all kinds of the display devices.

SUMMARY

The present disclosure provides an organic light-emitting structure, and a display device, to solve the above-mentioned problems.

A first aspect of the present disclosure is to provide an organic light-emitting structure, including a first light-emitting unit, a second light-emitting unit, a third light-emitting unit, and a fourth light-emitting unit; each of the first light-emitting unit, the second light-emitting unit, the third light-emitting unit, and the fourth light-emitting unit includes a first electrode, a second electrode, and an organic laminated body; one of the first electrode and the second electrode is a translucent electrode; and the organic laminated body includes a light-emitting layer; and at least one of the first light-emitting unit, the second light-emitting unit, the third light-emitting unit, and the fourth light-emitting unit is a fluorescent-light emitting unit.

A second aspect of the present disclosure is to provide a display device, including the organic light-emitting structure as mentioned above.

It should be understood that, the general description as above and the detailed description hereinafter are exemplary, and they do not limit the present disclosure.

BRIEF DESCRIPTION OF DRAWINGS

FIG. 1 is a structural schematic diagram of an organic light-emitting structure according to an embodiment of the present disclosure.

REFERENCE

100—first light-emitting unit
101—first light-emitting layer
102—first monochromic hole transmission layer
200—second light-emitting unit
201—second light-emitting layer
202—second monochromic hole transmission layer
300—third light-emitting unit
301—third light-emitting layer
302—third monochromic hole transmission layer
400—fourth light-emitting unit
401—fourth light-emitting layer
202—fourth monochromic hole transmission layer
500—first electrode
600—second electrode
700—organic laminated body
701—common hole injection layer
702—common hole transmission layer
703—common electron transmission layer
800—substrate
900—light extraction layer The above-mentioned drawing is incorporated into the specification and constitutes a part of the specification, which shows embodiments according to the present disclosure, and is used for illustrating principles of the present disclosure.

DESCRIPTION OF EMBODIMENTS

The present disclosure will be described in details with reference to the accompanying drawing and embodiments thereof.

As shown in FIG. 1, an embodiment of the present disclosure provides an organic light-emitting structure, which can be used for AMOLED. The organic light-emitting structure includes a first light-emitting unit 100, a second light-emitting unit 200, a third light-emitting unit 300, and a fourth light-emitting unit 400. Each of the first light-emitting unit 100, the second light-emitting unit 200, the third light-emitting unit 300, and the fourth light-emitting unit 400 includes a first electrode 500, a second electrode 600, and an organic laminated body 700 placed between the first electrode 500 and the second electrode 600. One of the first electrode 500 and the second electrode 600 is a translucent electrode. The organic laminated body 700 includes a light-emitting layer. Furthermore, at least one of the first light-emitting unit 100, the second light-emitting unit 200, the third light-emitting unit 300, and the fourth light-emitting unit 400 is a fluorescent-light emitting unit. That is to say, only one, two or three of the first light-emitting unit 100, the second light-emitting unit 200, the third light-emitting unit 300, and the fourth light-emitting unit 400 can be fluorescent-light emitting unit, or all of them can be fluorescent-light emitting units. Colors of lights emitted from the first light-emitting unit 100, the second light-emitting unit 200, the third light-emitting unit 300, and the fourth light-emitting unit 400 are different from each other. For example, the light colors of the four units can be blue, green, yellow, and red, respectively. The organic laminated body 700 usually includes a common electron transmission layer 703, a hole transmission layer, and a light-emitting layer. The light-emitting layer is placed between the common electron transmission layer 703 and the hole transmission layer. In the light-emitting unit (e.g., the first light-emitting unit 100, the second light-emitting unit 200, the third light-emitting unit 300, or the fourth light-emitting unit 400), an ITO transparent electrode and a metal electrode are used as an anode (i.e., the first electrode 500) and a cathode (i.e., the second electrode 600) of the light-emitting unit, respectively. Driven under a certain voltage, electrons and holes are respectively injected into the common electron transmission layer and the hole transmission layer from the cathode and the anode, are transmitted to the light-emitting layer through the common electron transmission layer and the hole transmission layer, respectively, and meet each other in the light-emitting layer, thereby forming excitons and exciting the luminescent molecules, and the luminescent molecules emitting the visible light by radiation relaxation.

Light of each light-emitting unit comes from the light-emitting layer of the organic laminated body 700. The light-emitting layer of the first light-emitting unit 100 can be defined as a first light-emitting layer 101, the light-emitting layer of the second light-emitting unit 200 can be defined as a second light-emitting layer 201, the light-emitting layer of the third light-emitting unit 300 can be defined as a third light-emitting layer 301, and the light-emitting layer of the fourth light-emitting unit 400 can be defined as a fourth light-emitting layer 401. One, two, three, or four of the first light-emitting layer 101, the second light-emitting layer 201, the third light-emitting layer 301, and the fourth light-emitting layer 401 can be made of fluorescent material.

Conventional organic light-emitting structure uses the three primary colors of RGB, so that it is needed to extract yellow light from yellow spectrum including red light and green light when displaying. However, in the present disclosure, the organic light-emitting structure includes the above-mentioned four light-emitting units, including the first light-emitting unit, the second light-emitting unit, the third light-emitting unit, and the fourth light-emitting unit. Light colors of the four light-emitting units are different from each other, and one of the four light-emitting units can be a yellow-light emitting unit. Thus, the yellow-light emitting unit can be an independent light-emitting unit, and can independently display yellow color. Compared with the yellow light extracted from the conventional three primary colors of RGB, the yellow light emitted by the yellow-light emitting unit is purer, which can expand color gamut range. In addition, the wider color gamut range can be combined with the RGB three primary colors in various ways, so that more colors can be displayed, the color saturation of the light-emitting device is improved, and the color quantity is increased, for better meeting the development trend of color reproducibility of the display device. Furthermore, among four colors of red, green, blue, and yellow, a service lifetime of phosphorescence emitting blue light is relatively short, which results in that the blue light substantially cannot be used, while a service lifetime of blue light of fluorescence is relatively long, so that at least one of the first light-emitting unit 100, the second light-emitting unit 200, the third light-emitting unit 300, and the fourth light-emitting unit 400 is the fluorescent light-emitting unit, in particular, one light-emitting unit used as a blue-light emitting unit is preferably the fluorescent light-emitting unit, which can prolong the service lifetime of the organic light-emitting structure, and enrich material kinds of light-emitting layer of each light-emitting unit, so as to facilitate to select material.

Usually, each of the first light-emitting unit 100, the second light-emitting unit 200, the third light-emitting unit 300, and the fourth light-emitting unit 400 further includes a substrate 800. The first electrode 500, the organic laminated body 700, and the second electrode 600 are placed on one side of the substrate 800. The first light-emitting unit 100, the second light-emitting unit 200, the third light-emitting unit 300, and the fourth light-emitting unit 400 can share one substrate 800. The substrate 800 can be a glass substrate, and a thin film transistor can be placed on the substrate 800, so that working states of the first light-emitting unit 100, the second light-emitting unit 200, the third light-emitting unit 300, and the fourth light-emitting unit 400 can be controlled.

In nature, the luminous efficiency of the phosphorescent materials is greater than the luminous efficiency of the fluorescent materials, so that at least one of the first light-emitting unit 100, the second light-emitting unit 200, the third light-emitting unit 300, and the fourth light-emitting unit 400 is a fluorescent light-emitting unit, and the others are phosphorescent light-emitting units. That is to say, among the four light-emitting units, there are both fluorescent light-emitting unit and the phosphorescent light-emitting unit. For example, the first light-emitting unit 100 is the fluorescent light-emitting unit, and the second light-emitting unit 200, the third light-emitting unit 300, and the fourth light-emitting unit 400 are phosphorescent light-emitting units. That is to say, the material of the first light-emitting layer 101 is the fluorescent material, to form the first light-emitting unit 100 as the fluorescent light-emitting unit, and the materials of the second light-emitting unit 200, the third light-emitting unit 300, and the fourth light-emitting unit 400 are the phosphorescent materials, to form the second light-emitting unit 200, the third light-emitting unit 300, and the fourth light-emitting unit 400 as the phosphorescent light-emitting units. Since among materials for emitting blue, green, yellow, and red lights, only the phosphorescent materials for emitting red, green, and yellow lights are abundant and have a long service time, while phosphorescent materials for emitting blue light are not abundant, and has a short service time, in practical use, some light-emitting unit adopts the phosphorescent materials, while some light-emitting unit adopts the fluorescent materials, especially, the light-emitting unit emitting blue light adopts the fluorescent materials, and the other light-emitting units adopt the phosphorescent materials, so that the luminous efficiency of the other light-emitting units can be improved greatly, the service life of the organic light-emitting structure can be prolonged, and the luminous efficiency of each light-emitting unit can be improved.

Among various display devices, a wavelength of light emitted from the light-emitting unit has a significant effect on the color purity of a display panel. In the present disclosure, the emission wavelengths of the first light-emitting unit 100, the second light-emitting unit 200, the third light-emitting unit 300, and the fourth light-emitting unit 400 successively increase, the peak wavelength of each light-emitting unit is precisely controlled, and the pick wavelengths of the first light-emitting unit 100, the second light-emitting unit 200, the third light-emitting unit 300, and the fourth light-emitting unit 400 successively increase, i.e., the peak wavelength of the second light-emitting unit 200 is greater than the peak wavelength of the first light-emitting unit 100, the peak wavelength of the third light-emitting unit 300 is greater than the peak wavelength of the second light-emitting unit 200, and the peak wavelength of the fourth light-emitting unit 400 is greater than the peak wavelength of the third light-emitting unit 300. Optionally, the wavelength of the first light-emitting unit 100 is in a range of 440 nm-480 nm, the wavelength of the second light-emitting unit 200 is in a range of 500 nm-540 nm, the wavelength of the third light-emitting unit 300 is in a range of 550 nm-590 nm, and the wavelength of the fourth light-emitting unit 400 is in a range of 600 nm-640 nm, so that the peak wavelengths of the four light-emitting units do not overlap with each other, and a range of the wavelength is narrow. Thus, a color of light emitted from each light-emitting unit is purer, and the color purity of the display panel can be effectively improved.

In each light-emitting unit, one of the first electrode 500 and the second electrode 600 is a translucent electrode. When light passes through the translucent electrode, transmission and reflection may happen, and in that case, light interference will happen in the light-emitting unit, forming a microcavity effect. By changing the transmission route of light in the microcavity (optical distance), a wavelength range of light can be narrowed as smaller as possible, so that monochromaticity can be better, thereby improving the luminous efficiency of each light-emitting member. Since light interference will happen in the microcavity of each light-emitting unit, each light-emitting unit can define a light intensity according to selection of length of light route (optical distance). That is to say, while the light intensity increases, the optical distance increases, the wavelengths of the light-emitting units are different from each other. Wavelengths of light emitted from the first light-emitting unit 100, the second light-emitting unit 200, the third light-emitting unit 300, and the fourth light-emitting unit 400 are different from each other. Accordingly, optimal thicknesses of the organic laminated bodies 700 of the light-emitting units are different from each other. The thickness of the organic laminated body 700 can be adjusted to adapt to the corresponding wavelength. That is to say, by adjusting the optical distance of light emitted from each light-emitting unit, the intensity of light emitting out of the light-emitting unit can be optimized.

While an emission wavelength of the first light-emitting unit 100, an emission wavelength of the second light-emitting unit 200, an emission wavelength of the third light-emitting unit 300, and an emission wavelength of the fourth light-emitting unit 400 successively increase, i.e., the emission wavelength of the second light-emitting unit 200 is greater than the emission wavelength of the first light-emitting unit 100, the emission wavelength of the third light-emitting unit 300 is greater than the emission wavelength of the second light-emitting unit 200, and the emission wavelength of the fourth light-emitting unit 400 is greater than the emission wavelength of the third light-emitting unit 300, the thicknesses of the first light-emitting layer 101, the second light-emitting layer 201, the third light-emitting layer 301, and the fourth light-emitting layer 401 also successively increase, i.e., the thickness of the second light-emitting layer 201 is greater than the thickness of the first light-emitting layer 101, the thickness of the third light-emitting layer 301 is greater than the thickness of the second light-emitting layer 201, and the thickness of the fourth light-emitting layer 401 is greater than the thickness of the third light-emitting layer 301. Therefore, by setting the thicknesses of the light-emitting layers, the optical distances of light inside the light-emitting units are different from each other, so that the intensity of light emitted out of the light-emitting unit increases, thereby improving the luminous efficiency and brightness of the organic light-emitting structure.

Optionally, the first light-emitting unit 100, the second light-emitting unit 200, the third light-emitting unit 300, and the fourth light-emitting unit 400 are successively placed along an extending direction of the substrate 800 as shown in FIG. 1. In this case, the thickness of the first light-emitting layer 101 is in a range of 18 nm-22 nm, such as 18 nm, 19 nm, 20 nm, 21 nm, and 22 nm. The thickness of the second light-emitting layer 20l is in a range of 31.5 nm-38.5 nm, such as 32.5 nm, 33 nm, 35 nm, 37 nm, 38 nm, and 38.5 nm. The thickness of the third light-emitting layer 301 is in a range of 31.5 nm-38.5 nm, such as 32.5 nm, 33 nm, 35 nm, 37 nm, 38 nm, and 38.5 nm. The thickness of the fourth light-emitting layer 401 is in a range of 36 nm-44 nm, such as 36 nm, 38 nm, 40 nm, 42 nm, 43 nm, and 44 nm. Since the thicknesses of the light-emitting layers of the light-emitting units are different from each other, the optical distances of light in the microcavity of the light-emitting units can be effectively controlled, so that the microcavity effect can be optimized, thereby improving the luminous efficiency of each light-emitting unit.

Furthermore, the thickness of a hole transmission layer of the first light-emitting unit 100, the thickness of a hole transmission layer of the second light-emitting unit 200, the thickness of a hole transmission layer of the third light-emitting unit 300, and the thickness of a hole transmission layer of the fourth light-emitting unit 400 successively increase, that is, the thickness of a hole transmission layer of the second light-emitting unit 200 is greater than the thickness of a hole transmission layer of the first light-emitting unit 100, the thickness of a hole transmission layer of the third light-emitting unit 300 is greater than the thickness of a hole transmission layer of the second light-emitting unit 200, and the thickness of a hole transmission layer of the fourth light-emitting unit 400 is greater than the thickness of a hole transmission layer of the third light-emitting unit 300, so that, by adjusting the thickness of each film layer in the organic laminated body 700, the optical distance of light in the microcavity of each light-emitting unit can be adjusted, to better adapt wavelength of different light-emitting unit and to optimize the microcavity effect, thereby improving the luminous efficiency of the entire organic light-emitting structure.

The hole transmission layer of each light-emitting unit can only include a monochromic hole transmission layer. In that case, in each light-emitting unit, the thickness of the monochromic hole transmission layer is equal to the thickness of the hole transmission layer. Since electrons can leak from the light-emitting layer, the electrons can enter into the hole transmission layer contacting with the electrons, and the higher the hole mobility of a material, the more easily the material decomposes. Thus, for decreasing decomposition of the hole transmission layer as possible, the hole transmission layer of each light-emitting unit includes the monochromic hole transmission layer and common hole transmission layer 702 stacked together with the monochromic hole transmission layer, and the common hole transmission layer 702 is away from the light-emitting layer relative to the monochromic hole transmission layer. In that case, the thickness of the hole transmission layer is equal to a sum of the thickness of the common hole transmission layer 702 and the thickness of the monochromic hole transmission layer. As shown in FIG. 1, the material of the common hole transmission layer 702 is different from the material of the monochromic hole transmission layer. That is to say, each of the first light-emitting unit 100, the second light-emitting unit 200, the third light-emitting unit 300, and the fourth light-emitting unit 400 includes the common hole transmission layer 702 and the monochromic hole transmission layer, and the monochromic hole transmission layer is adjacent to the light-emitting layer, so that each common hole transmission layer 702 is made of a same material, and is made of a commonly used hole transmission material; and the monochromic hole transmission layers are made of different electron-resistant materials, for preventing the electron in the light-emitting layer from entering into the monochromic hole transmission layer and preventing the decomposition of the monochromic hole transmission layer, and thereby prolonging the service life time of the organic light-emitting structure. Additionally, in that case, the thickness of the hole transmission layer of the organic laminated body 700 can be increased, charge carriers of each light-emitting unit can achieve equilibrium, and preventing forming of a poor structure, for example, a structure in which particles are formed.

The monochromic hole transmission layer of the first light-emitting unit 100 can be defined as a first monochromic hole transmission layer 102, the monochromic hole transmission layer of the second light-emitting unit 200 can be defined as a second monochromic hole transmission layer 202, the monochromic hole transmission layer of the third light-emitting unit 300 can be defined as a third monochromic hole transmission layer 302, and the monochromic hole transmission layer of the fourth light-emitting unit 400 can be defined as a fourth monochromic hole transmission layer 402. The first monochromic hole transmission layer 102, the second monochromic hole transmission layer 202, the third monochromic hole transmission layer 302, and the fourth monochromic hole transmission layer 402 are separately prepared, respectively. In that manner, the thicknesses of the common hole transmission layers 402 are identical, and the thickness of the first monochromic hole transmission layer 102, the thickness of the second monochromic hole transmission layer 202, the thickness of the third monochromic hole transmission layer 302, and the thickness of the fourth monochromic hole transmission layer 402 successively increase, i.e., the thickness of the second monochromic hole transmission layer 202 is greater than the thickness of the first monochromic hole transmission layer 102, the thickness of the third monochromic hole transmission layer 302 is greater than the thickness of the second monochromic hole transmission layer 202, and the thickness of the fourth monochromic hole transmission layer 402 is greater than the thickness of the third monochromic hole transmission layer 302, so that the optical distance in the microcavity can be changed by adjusting the thickness of the monochromic hole transmission layer, thereby optimizing the microcavity effect. Among the thickness of the first monochromic hole transmission layer 102, the thickness of the second monochromic hole transmission layer 202, the thickness of the third monochromic hole transmission layer 302, and the thickness of the fourth monochromic hole transmission layer 402, a thickness difference between any two adjacent monochromic hole transmission layers can be equal or not be equal. As shown in FIG. 1, the thickness of the first monochromic hole transmission layer 102 is 10 nm, the thickness of the second monochromic hole transmission layer 202 is 30 nm, the thickness of the third monochromic hole transmission layer 302 is 50 nm, and the thickness of the fourth monochromic hole transmission layer 402 is 70 nm, and the thicknesses difference between any two adjacent monochromic hole transmission layers is 20 nm. It can be understood that, the thickness of the first monochromic hole transmission layer 102, the thickness of the second monochromic hole transmission layer 202, the thickness of the third monochromic hole transmission layer 302, and the thickness of the fourth monochromic hole transmission layer 402 can be other values. As shown in FIG. 1, all the common hole transmission layers 702 can be prepared integrally to form an integrated layer. That is to say, the common hole transmission layers 702 of the light-emitting units are made of a same material.

In that case, for optimizing the microcavity effect, each of the first monochromic hole transmission layer 102, the second monochromic hole transmission layer 202, the third monochromic hole transmission layer 302, and the fourth monochromic hole transmission layer 402 have an optimal thickness. Optionally, the thickness of the first monochromic hole transmission layer 102 is in a range of 9 nm-11 nm, such as 9 nm, 10 nm, 10.5 nm, and 11 nm; the thickness of the second monochromic hole transmission layer 202 is in a range of 27 nm-33 nm, such as 27 nm, 29 nm, 30 nm, 32 nm, 32.5 nm, and 33 nm; the thickness of the third monochromic hole transmission layer 302 is in a range of 45 nm-55 nm, such as 45 nm, 48 nm, 50 nm, 53 nm, 54.5 nm, and 55 nm; the thickness of the fourth monochromic hole transmission layer 402 is in a range of 63 nm-77 nm, such as 63 nm, 66 nm, 69 nm, 70 nm, 73 nm, 75 nm, and 77 nm. By using the above-mentioned configuration, the microcavity effect can be optimized, and the light intensity can be maximized, thereby improving the luminous efficiency of the organic light-emitting structure. Optionally, the thickness of the common hole transmission layer 702 is in a range of 117 nm-143 nm; a thickness of a common hole injection layer 701 is in a range of 9 nm-11 nm, such as 9 nm, 10 nm, and 11 nm; a thickness of a common electron transmission layer is in a range of 31.5 nm-38.5 nm, such as 31.5 nm, 33 nm, 35 nm, 37 nm, and 38.5 nm.

In addition, for providing enough holes for the hole transmission layer, the organic laminated body further includes a common hole injection layer 701. In any one of the first light-emitting unit 100, the second light-emitting unit 200, the third light-emitting unit 300, and the fourth light-emitting unit 400, the first electrode 500, the common hole injection layer 701, the common hole transmission layer 702, the monochromic hole transmission layer, the common electron transmission layer 703, and the second electrode 600 are successively stacked, that is, the common hole injection layer 701 is stacked on a surface of the first electrode 500, the common hole transmission layer 702 is stacked on a surface of the common hole injection layer 701 away from the first electrode 500, the monochromic hole transmission layer is stacked on a surface of the common hole transmission layer 702 away from the first electrode 500, the common electron transmission layer 703 is stacked on a surface of the monochromic hole transmission layer away from the first electrode 500, and the second electrode 600 is stacked on a surface of the common electron transmission layer 703 away from the first electrode 500.

In the above-mentioned embodiments, the first electrode 500 can be an anode, the second electrode 600 can be a cathode, and the organic light-emitting structure can be in a top emission mode or in a bottom emission mode.

In the bottom emission mode, the first electrode 500 is a translucent electrode, and the second electrode 600 is a non-transparent electrode. The first electrode 500 is formed on the substrate 800, the organic laminated body 700 is formed on a side of the first electrode 500 away from the substrate 800, and finally, the second electrode 600 is prepared on a side of the organic laminated body 700 away from the first electrode 500. In such organic light-emitting structure, light is extracted from one side of the anode (the first electrode 500).

In the top emission mode, the first electrode 500 is a non-transparent anode electrode, and the second electrode 600 is a translucent cathode electrode. The first electrode 500 is formed on the substrate 800, the organic laminated body 700 is then formed on a side of the first electrode 500 away from the substrate 800, and finally, the second electrode 600 is formed on a side of the organic laminated body 700 away from the first electrode 500. In such organic light-emitting structure, light is extracted from one side of the second electrode 600.

It should be noted that, in the top emission mode, for improving the luminous efficiency of the organic light-emitting structure, each of the first light-emitting unit 100, the second light-emitting unit 200, the third light-emitting unit 300, and the fourth light-emitting unit 400 further includes a reflection film 1000. The reflection film 1000 is placed on one side of the first electrode 500 away from the organic laminated body, so that light emitted toward the substrate 800 can be reflected by the reflection film 1000 to the second electrode 600, for improving the luminous efficiency of the organic light-emitting structure.

In the top emission mode, because of the reflection film 1000, light emitted from the organic laminated body may direct to the reflection film 1000 and the translucent electrode, respectively; light directing to the reflection film 1000 is reflected by the reflection film 1000 and then turns to the translucent electrode; and a part of light directing to the translucent electrode passes through the translucent electrode to outside, while the other part of light directing to the translucent electrode is reflected by a surface of the translucent electrode to the reflection film 1000. Those three parts of light interfere in each light-emitting unit (such as the first light-emitting unit 100, the second light-emitting unit 200, the third light-emitting 300, and the fourth light-emitting unit 400), so that the organic light-emitting structure can fully use the microcavity effect, and the luminous efficiency is improved. Therefore, preferably, the organic light-emitting structure adopts the top emission mode.

It should be understood that, light reflected by the reflection film 1000 exits from the light-emitting unit through the first electrode 500, the organic laminated body 700, and the second electrode 600, so that one surface of the reflection film 1000 away from the substrate 800 is a working surface. That is to say, the surface of the reflection film 1000 away from the substrate 800 is a reflection surface. Therefore, for decreasing blockage to the light transmission, decreasing light loss of the light transmission, and better improving the luminous efficiency, the reflection film 1000 and the first electrode 500 share one interface, that is to say, the reflection film 1000 is laminated onto the first electrode 500; while the reflection film 1000 and the substrate 800 may share one interface or may not share one interface, for example, a thin film transistor can be placed between the reflection film 1000 and the substrate 800.

If the reflection efficiency of the reflection film 1000 is relatively small, the luminous efficiency of the organic light-emitting structure will decrease. Considering that a sensitive visible wavelength for human eyes is about 500 nm, the reflection film 1000, whose reflectivity for a light with wavelength of 500 nm is equal to or greater than 70%, such as 70%, 75%, 80%, 85%, 88%, and 90%, is preferably selected. In that case, sufficient light can be reflected, and then shoots out from the second electrode 600, so that an integral luminous efficiency of the organic light-emitting structure is improved. A material of the reflection film 1000 can be silver alloy, and can be formed by a sputtering coating method using a silver target material. The reflectivity of the reflection film 1000 made of silver alloy to light with wavelength of 500 nm can reach 85%.

It should be noted that, the reflectivity of the reflection film 1000 to light with wavelength of 500 nm can be smaller than 70%, and the transmissivity of the second electrode 600 to light with wavelength of 500 nm can be smaller than 20%.

In addition, the transmissivity of the translucent electrode has a significant effect on the luminous efficiency of the whole organic light-emitting structure. If the transmissivity of the translucent electrode is too small, the luminous efficiency and intensity of the whole light-emitting unit will decrease, and the luminous efficiency of the whole organic light-emitting structure will be affected. Therefore, the transmissivity of the translucent electrode to light with wavelength of 500 nm is at least 20%. For example, in the top emission mode, the transmissivity of the second electrode 600 to light with wavelength of 500 nm is at least 20%, such as 20%, 25%, 30%, 35%, and 50%, for improving the luminous efficiency of the organic light-emitting structure. The translucent cathode can be made of Mg material and Ag material, and a molar ratio of the Mg material to the Ag material can be 10:1. When the thickness of the translucent cathode is 14 nm, the transmissivity can reach 35%.

In either the top emission mode or the bottom emission mode, in each of the first light-emitting unit 100, the second light-emitting unit 200, the third light-emitting unit 300, and the fourth light-emitting unit 400, the first electrode 500, the second electrode 600, the common hole injection layer 701, the common hole transmission layer 702, and the common electron transmission layer 703 are common layers for the four light-emitting units, thus, all the first electrodes 500 can be made together, all the second electrodes can be integrally made together, all the common hole injection layers 701 can be made together, all the common hole transmission layers 702 can be made together, and all the common electron transmission layers 703 can be made together.

In addition, at least one of the first light-emitting unit 100, the second light-emitting unit 200, the third light-emitting unit 300, and the fourth light-emitting unit 400 further includes a light extraction layer 900. Usually, each of the first light-emitting unit 100, the second light-emitting unit 200, the third light-emitting unit 300, and the fourth light-emitting unit 400 includes the light extraction layer 900. The light extraction layer 900 is covered on one side of the translucent electrode away from the organic laminated body. The luminous intensity, brightness and efficiency are adjusted by adjusting the light interference in the microcavity, so that the refractive index of the organic laminated body 700 is limited, while the refractive index of the light extraction layer 900 can be greater than the refractive index of the organic laminated body 700. Thus, brightness of light emitted from the light-emitting unit is greater relatively. Especially in the blue-light emitting unit, the effect is more obvious. For example, the brightness of the blue-light emitting unit with the light extraction layer 900 is 10% greater than the brightness of the blue-light emitting unit without a light extraction layer. Optionally, the refractive index of the light extraction layer 900 to light with wavelength of 500 nm is greater than 1.85, so that light emitted from the organic laminated body 700 has enough brightness after passing through the translucent electrode, thereby improving the luminous efficiency of the whole organic light-emitting structure. Optionally, the thickness of the light extraction layer 900 is in a range of 54 nm-66 nm, such as 54 nm, 58 nm, 60 nm, 65 nm, 67 nm, and 68 nm. Since wavelength of blue light, wavelength of green light, wavelength of yellow light, and wavelength of red light successively increase (i.e., the wavelength of green light is greater than the wavelength of blue light, the wavelength of yellow light is greater than the wavelength of green light, and the wavelength of red light is greater than the wavelength of yellow light), it is set that the first light-emitting unit 100 is a blue-light emitting unit, the second light-emitting unit 200 is a green-light emitting unit, the third light-emitting unit 300 is a yellow-light emitting unit, and the fourth light-emitting unit 400 is a red-light emitting unit. That is to say, the material of the first light-emitting layer 101 is blue-light emitting material, the material of the second light-emitting layer 201 is green-light emitting material, the material of the third light-emitting layer 301 is yellow-light emitting material, and the material of the fourth light-emitting layer 401 is red-light emitting material. Thus, by different combinations of lights of blue, green, yellow, and red colors, abundant colors are achieved.

As described above, the luminous efficiency of the phosphorescent light-emitting material is relatively high, while the stability of the phosphorescent light-emitting material that emits blue light is poor, and the service life time thereof is short, so that when the first light-emitting unit 100 is a blue-light emitting unit, the material of the first light-emitting layer 101 is preferably the fluorescent material that emits blue light. That is to say, the first light-emitting unit 100 is a fluorescent light-emitting unit.

Considering the advantage of the luminous efficiency of the phosphorescent material, the second light-emitting unit 200, the third light-emitting unit 300, and the fourth light-emitting unit 400 are selected to be phosphorescent light-emitting units. That is to say, the material of the second light-emitting layer 201 is a phosphorescent material that emits green light, the material of the third light-emitting layer 301 is a phosphorescent material that emits yellow light, and the material of the fourth light-emitting layer 401 is a phosphorescent material that emits red light, thereby improving the luminous efficiency of each light-emitting unit.

The material of the light-emitting layer of the phosphorescent light-emitting unit can be iridium compound or platinum compound. Since iridium compound includes various stable and highly effective materials emitting light in a field of from green light to yellow light, and has high luminous efficiency for green light and yellow light, materials of the second light-emitting layer 201 and third light-emitting layer 301 can include iridium compound, for further improving the luminous efficiency and brightness of the organic light-emitting structure. In addition, in that manner, the advantage of the luminous efficiency of the phosphorescent material is fully utilized to improve the luminous efficiency of the organic light-emitting structure at low power consumption.

It should be noted that, the above-described various organic light-emitting structure can be made by coating. As shown in FIG. 1, common layers of the first light-emitting layer 100, the second light-emitting layer 200, the third light-emitting layer 300, and the fourth light-emitting layer 400, such as the substrate 800, the first electrode 500, the reflection film 1000 (in top emission mode), the common hole injection layer 701, the common hole transmission layer 702, the common electron transmission layer 703, the second electrode 600, and the light extraction layer 900, can be directly prepared by coating, for example, by an integral evaporation method using a common material, that is, each common layer is shared by the four light-emitting layers, and each common layer can be integrally formed by evaporation using a same material. Different layers, such as the first light-emitting layer 101, the second light-emitting layer 201, the third light-emitting layer 301, the fourth light-emitting layer 401, the first monochromic hole transmission layer 102, the second monochromic hole transmission layer 202, the third monochromic hole transmission layer 302, the fourth monochromic hole transmission layer 402, can be made by fine mask. Openings corresponding to different layers of each light-emitting unit are defined in the fine mask. In fine mask method, the thickness of the first electrode 500 can be in a range of 9 nm-11 nm, such as 9 nm, 10 nm, and 11 nm; and the thickness of the second electrode 600 can be 12.6 nm-15.4 nm, such as 12.6 nm, 13 nm, 14 nm, 15 nm, and 15.4 nm.

Detailed preparing process is illustrated as follows:

First, preparing the substrate 800; wherein the substrate 800 can be a glass substrate, and a thin film transistor can be directly formed on the substrate; a material of the thin film transistor can be low temperature poly-silicon, amorphous silicon, or oxide semiconductor; the oxide semiconductor can be In—Ce—Zn, In—Y—Zn, In—Ga—Zn, In—Zr—Zn, In—La—Zn, In—Nd—Zn, or In—Ga.

The pixels can be formed on the thin film transistor in advance, and four sub-pixels form a pixel. The four sub-pixels correspond to the first light-emitting unit 100, the second light-emitting unit 200, the third light-emitting unit 300, and the fourth light-emitting unit 400, respectively. The four sub-pixels are independent from each other, and are driven by controlling the thin film transistor. The reflection film 1000 with a thickness of 100 nm is formed on the sub-pixels by sputtering method using a silver target material. The first electrode 500 with a thickness of 10 nm is formed on the reflection film 1000 (an oxide film). It can be understood that, the reflection film 1000 can also be made of silver alloy.

The organic laminated body is prepared on the first electrode 500 by a vacuum evaporation method. The common layers are prepared by an integral evaporation method using a same material. The layers different from each other are prepared by fine mask. The different layers 100 in each of the first light-emitting unit 100, the second light-emitting unit 200, the third light-emitting unit 300, and the fourth light-emitting unit 400 are respectively formed by evaporation method using different materials. At this time, openings are defined in the fine mask respectively corresponding to the sub-pixels in the first light-emitting unit 100, the second light-emitting unit 200, the third light-emitting unit 300, and the fourth light-emitting unit 400. Through areas of the openings, the different layers are formed by selective evaporation of needed material for each light-emitting unit. Operation is as follows:

Compound I as the material of the common hole injection layer 701 is evaporated with a thickness of 10 nm. Then, Compound II as the material of the common hole transmission layer 702 is evaporated with a thickness of 130 nm.

Next, the microcavity is prepared by different materials. In the blue-light emitting unit, Compound III as the material of the blue-light hole transmission layer is evaporated with a thickness of 10 nm, to form the first monochromic hole transmission layer 102; in the green-light emitting unit, Compound IV as the material of the green-light hole transmission layer is evaporated with a thickness of 30 nm, to form the second monochromic hole transmission layer 202; in the yellow-light emitting unit, Compound V as the material of the green-light hole transmission layer is evaporated with a thickness of 50 nm, to form the third monochromic hole transmission layer 302; and in the red-light emitting unit, a Compound VI as the material of the red-light hole transmission layer is evaporated with a thickness of 70 nm, to form the fourth monochromic hole transmission layer 402.

After that, on the above-described monochromic hole transmission layers, the first light-emitting layer 101, the second light-emitting layer 201, the third light-emitting layer 301, and the fourth light-emitting layer 401 are respectively prepared by fine mask. In the blue-light emitting unit, Compound VII as the main blue-light emitting material and Compound VIII as a blue-light dopant are evaporated together, to form the first light-emitting layer 101 with a thickness of 20 nm; in the green-light emitting unit, Compound IX as the main green-light emitting material and Compound X as a green light dopant are evaporated together, to form the second light-emitting layer 201 with a thickness of 35 nm; in the yellow-light emitting unit, Compound XI as the main yellow-light emitting material and Compound XII as a yellow light dopant are evaporated together, to form the third light-emitting layer 301 with a thickness of 20 nm; and in the red-light emitting unit, a Compound XIII as the main red-light emitting material and Compound XIV as a red light dopant are evaporated together, to form the fourth light-emitting layer 401 with a thickness of 40 nm.

Then, the common electron transmission layer 703 is prepared on each light-emitting layer. Compound XV and Compound XVI are evaporated together with a ratio of 1:1, to form the common electron transmission layer 703 with a thickness of 35 nm.

Following the preparation of the common electron transmission layer 703, the translucent cathode with a thickness of 14 nm is deposited on the common electron transmission layer 703 using Mg and Ag (with a ratio of 10:1), to form the second electrode 600. Measuring the translucent cathode, the transmittance of the translucent cathode is 35%.

On the second electrode 600, the light extraction layer 900 is prepared. Compound XVII is evaporated to prepare an optical adjustment common organic layer (also referred to as the light exaction layer 900). The refractive index of the optical adjustment common organic layer on wavelength of 500 nm is 1.85.

Finally, in a dried nitrogen environment, the organic light-emitting structure is covered by a selected packaging glass, and sealed by a Frit method (a laser welding method using glass powders), to finish preparation of the whole panel. Even though the organic light-emitting structure can be sealed by UV-curable resin, a better sealing effect can be obtained by the laser welding method using glass powders.

Parameters of the organic light-emitting structure prepared by the above-described process are shown in Table 1. In Table 1, Blue refers to the first light-emitting unit 100, Green refers to the second light-emitting unit 200, Yellow refers to the third light-emitting unit 300, Red refers to the fourth light-emitting unit 400, and CIE refers to coherent infrared energy.

TABLE 1

|  | Efficiency (cd/A) | Voltage (V) | CIE | Peak value of wavelength (nm) |
| --- | --- | --- | --- | --- |
| Blue | 4 | 3.9 | 0.13, 0.05 | 463 |
| Green | 85 | 4.1 | 0.24, 0.73 | 532 |
| Yellow | 78 | 4.0 | 0.48, 0.82 | 560 |
| Red | 25 | 4.2 | 0.66, 0.36 | 615 |

As shown in Table 1, using the organic light-emitting structure of the present disclosure, the desired luminous efficiency of each light-emitting unit can be surely obtained. At the same time, by combinations of the four kinds of light-emitting units, picture colors are richer, and picture quality is better.

Molecular formulas of compound I to compound XVII are as follows:

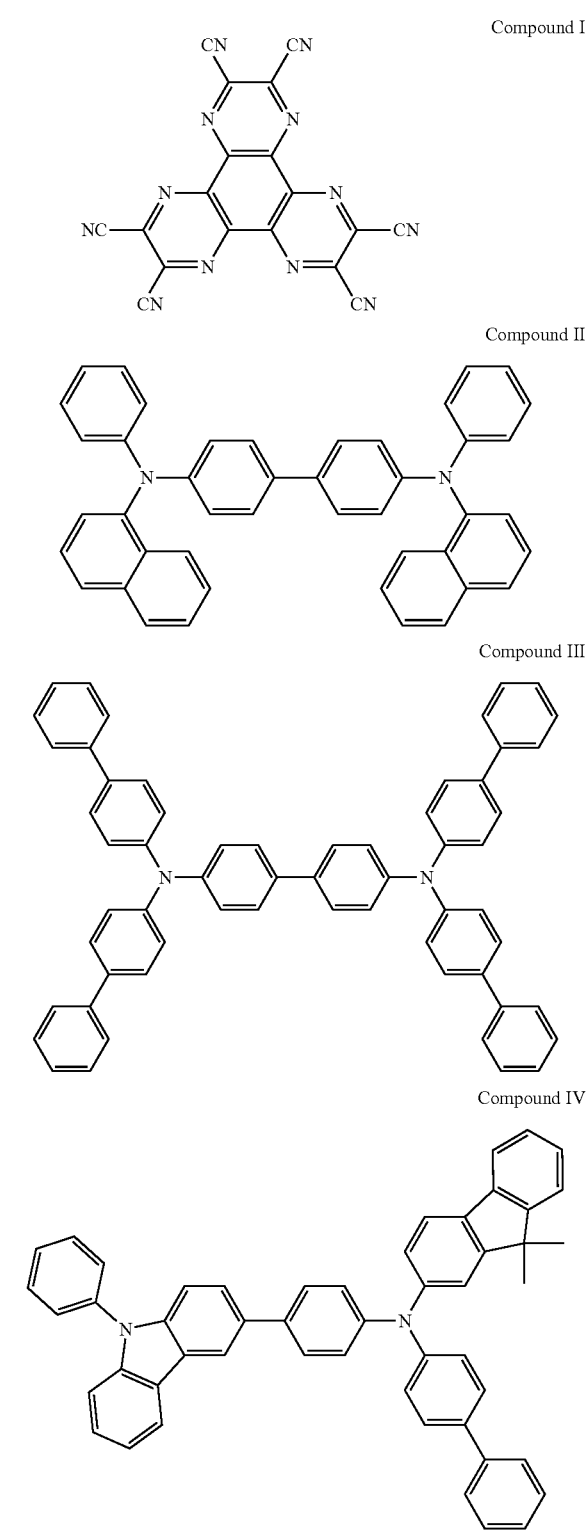

-continued
Compound V
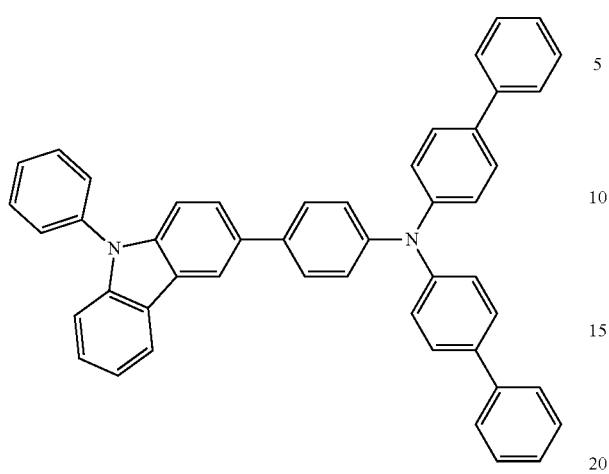
Compound VI
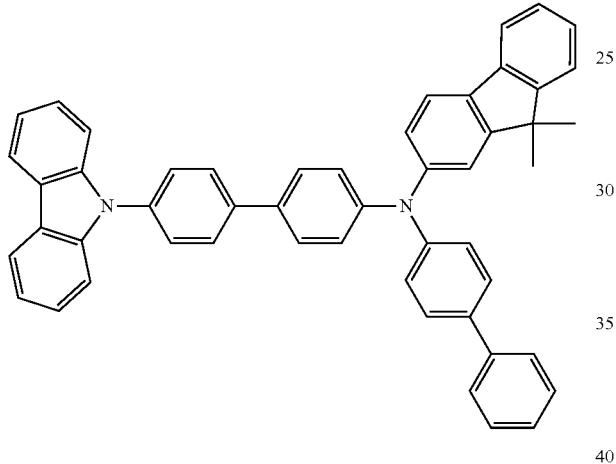
Compound VII
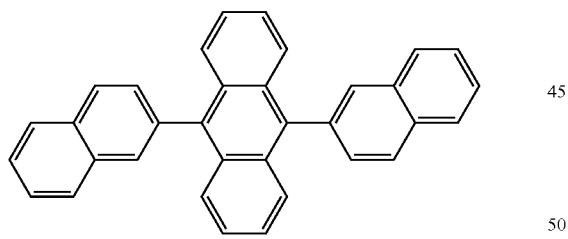
Compound VIII
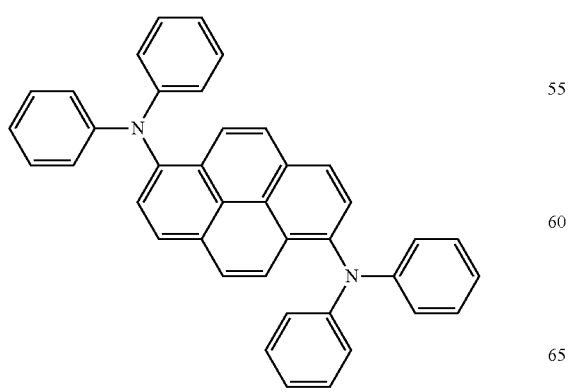
Compound IX
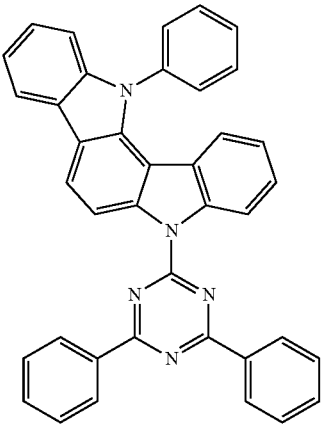
Compound X
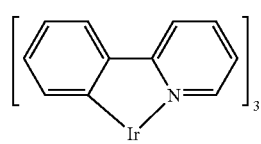
Compound XI
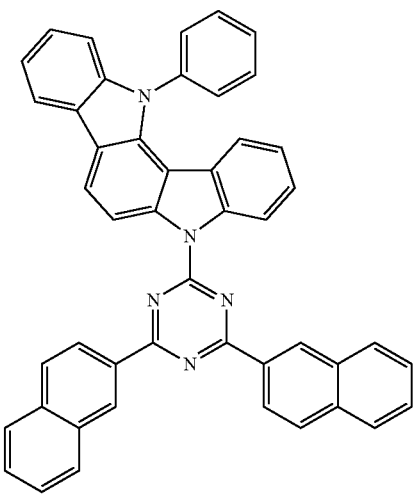
Compound XII
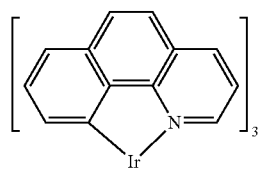
Compound XIII
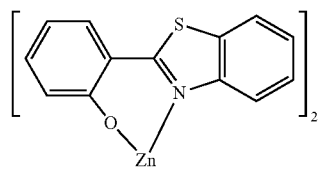

Compound XIV

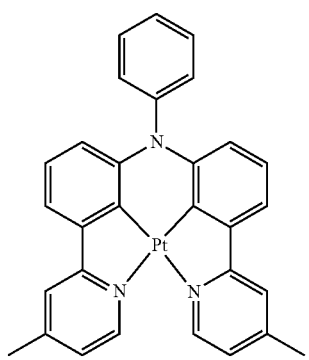

Compound XV

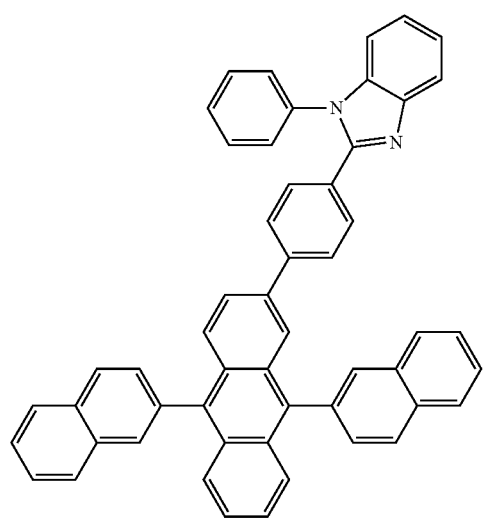

Compound XVI

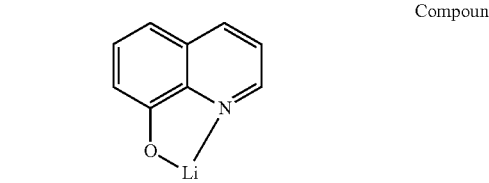

Compound XVII

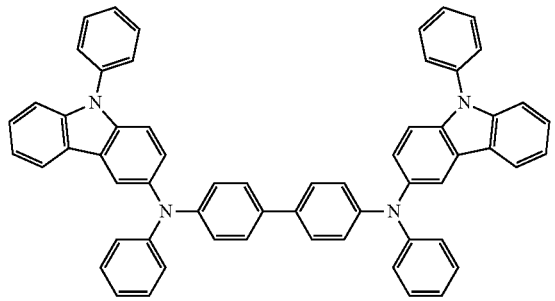

The organic light-emitting structure of the present disclosure can be formed by combination of white light and light filter. Compared with the coating method, the difference is: configuration of the organic laminated body 700 of the first light-emitting unit 100, the second light-emitting unit 200, the third light-emitting unit 300, and the fourth light-emitting unit 400 is identical, and their light-emitting layers are white-light emitting layers; and each of the first light-emitting unit 100, the second light-emitting unit 200, the third light-emitting unit 300, and the fourth light-emitting unit 400 includes the light filter, colors of the light filters are different from each other, and the light filter is placed on one side of the translucent electrode away from the organic laminated body 700. The light filter of the first light-emitting unit 100 can be defined as a first light filter; the light filter of the second light-emitting unit 200 can be defined as a second light filter; the light filter of the third light-emitting unit 300 can be defined as a third light filter; and the light filter of the fourth light-emitting unit 400 can be defined as a fourth light filter. When the first light-emitting unit 100 is blue-light emitting unit, the second light-emitting unit 200 is green-light emitting unit, the third light-emitting unit 300 is yellow-light emitting unit, and the fourth light-emitting unit 400 is red-light emitting unit, the first light filter is blue light filter, the second light filter is green light filter, the third light filter is yellow light filter, and the fourth light filter is red light filter. Thus, in the first light-emitting unit 100, by combination of the organic laminated body and the first light filter, the first light-emitting unit 100 emits blue light; in the second light-emitting unit 100, by combination of the organic laminated body and the second light filter, the second light-emitting unit 200 emits green light; in the third light-emitting unit 300, by combination of the organic laminated body and the third light filter, the third light-emitting unit 300 emits yellow light; in the fourth light-emitting unit 400, by combination of the organic laminated body and the fourth light filter, the fourth light-emitting unit 400 emits red light.

In that way, the organic laminated body 700 can include, successively stacked, a hole injection layer, a first hole transmission layer stacked on a surface of the hole injection layer, a blue-light emitting layer stacked on a surface of the first hole transmission layer away from the hole injection layer, a first electron transmission layer stacked on a surface of the blue-light emitting layer away from the hole injection layer, an N-type charge generation layer stacked on a surface of the first electron transmission layer away from the hole injection layer, a P-type charge generation layer stacked on a surface of the N-type charge generation layer away from the hole injection layer, a second hole transmission layer stacked on a surface of the P-type charge generation layer away from the hole injection layer, an orange-light emitting layer stacked on a surface of the second hole transmission layer away from the hole injection layer, a second electron transmission layer stacked on a surface of the orange-light emitting layer away from the hole injection layer, and an electron injection layer stacked on a surface of the second electron transmission layer away from the hole injection layer. The hole injection layer is closer to the first electrode 500 relative to the electron injection layer. By that configuration, the blue-light emitting layer and the orange-light emitting layer connected in series with the blue-light emitting layer, are made to combine, to finally emit white light, and then the organic laminated body 700 is made to emit white light. In addition, the N-type charge generation layer 708 and the P-type charge generation layer are added in the series structure, so that electrons and holes can be provided for the two light-emitting layers. In the structure formed by the hole injection layer, the first hole transmission layer, the blue-light emitting layer, the first electron transmission layer, the N-type charge generation layer, the P-type charge generation layer, the second hole transmission layer, the orange light-emitting layer, the second electron transmission layer, and the electron injection layer, electrons are provided by the N-type charge generation layer, and holes are provided by the P-type charge generation layer. Thus, a problem of insufficient charge injection is solved, and the luminous efficiency is kept high.

In addition, the present disclosure further provides a display device. The display device includes the organic light-emitting structure as described above.

The present disclosure further provides a mobile terminal, such as cellphone. The mobile terminal includes the display device as described above.

Embodiments described above are merely preferred embodiments of the present disclosure and they do not limit the present disclosure. Any modification, equivalent replacement, and improvement made within the spirit and principle of the present disclosure shall fall into the scope of the present disclosure.

What is claimed is:

1. An organic light-emitting structure, comprising:
   a first light-emitting unit,
   a second light-emitting unit,
   a third light-emitting unit, and
   a fourth light-emitting unit,
   wherein each of the first light-emitting unit, the second light-emitting unit, the third light-emitting unit, and the fourth light-emitting unit comprises a first electrode, a second electrode, and an organic laminated body placed between the first electrode and the second electrode; one of the first electrode and the second electrode is a translucent electrode; and the organic laminated body comprises a light-emitting layer; and at least one of the first light-emitting unit, the second light-emitting unit, the third light-emitting unit, and the fourth light-emitting unit is a fluorescent light-emitting unit,
   wherein an emission wavelength of the first light-emitting unit, an emission wavelength of the second light-emitting unit, an emission wavelength of the third light-emitting unit, and an emission wavelength of the fourth light-emitting unit successively increase,
   a thickness of the first light-emitting layer is in a range of 18 nm-22 nm, a thickness of the second light-emitting layer is in a range of 31.5 nm-38.5 nm, a thickness of the third light-emitting layer is in a range of 31.5 nm-38.5 nm, and a thickness of the fourth light-emitting layer is in a range of 36 nm-44 nm,
   the organic laminated body further comprises a monochromic hole transmission layer stacked with the light-emitting layer, the light-emitting layer is closer to the translucent electrode than the monochromic hole transmission layer is;
   the monochromic hole transmission layer of the first light-emitting unit is a first monochromic hole transmission layer, the monochromic hole transmission layer of the second light-emitting unit is a second monochromic hole transmission layer, the monochromic hole transmission layer of the third light-emitting unit is a third monochromic hole transmission layer, and the monochromic hole transmission layer of the fourth light-emitting unit is a fourth monochromic hole transmission layer;
   the first monochromic hole transmission layer, the second monochromic hole transmission layer, the third monochromic hole transmission layer and the fourth monochromic hole transmission layer are made of different electron-resistant materials;
   a thickness of the first monochromic hole transmission layer is in a range of 9 nm-11 nm, a thickness of the second monochromic hole transmission layer is in a range of 27 nm-33 nm, a thickness of the third monochromic hole transmission layer is in a range of 45 nm-55 nm, and a thickness of the fourth monochromic hole transmission layer is in a range of 63 nm-77 nm, and
   the organic laminated body further comprises a common hole transmission layer, the common hole transmission layer is stacked on one side of the monochromic hole transmission layer away from the light-emitting layer, and the common hole transmission layer and the monochromic hole transmission layer are made of different materials.

2. The organic light-emitting structure according to claim 1, wherein an emission wavelength of the first light-emitting unit, an emission wavelength of the second light-emitting unit, an emission wavelength of the third light-emitting unit, and an emission wavelength of the fourth light-emitting unit successively increase.

3. The organic light-emitting structure according to claim 2, wherein the light-emitting layer of the first light-emitting layer is a first light-emitting layer, the light-emitting layer of the second light-emitting layer is a second light-emitting layer, the light-emitting layer of the third light-emitting layer is a third light-emitting layer, and the light-emitting layer of the fourth light-emitting layer is a fourth light-emitting layer.

4. The organic light-emitting structure according to claim 1, wherein the first electrode is a non-transparent anode; and the second electrode is a translucent cathode.

5. The organic light-emitting structure according to claim 4, wherein each of the first light-emitting unit, the second light-emitting unit, the third light-emitting unit, and the fourth light-emitting unit further comprises a reflection film, and the reflection film is placed on one side of the first electrode away from the organic laminated body.

6. The organic light-emitting structure according to claim 5, further comprising:
   a substrate;
   wherein the substrate, the reflection film, and the first electrode are stacked up, and the reflection film is laminated onto the first electrode.

7. The organic light-emitting structure according to claim 5, wherein a transmissivity of the translucent electrode to light with a wavelength of 500 nm is at least 20%; and a reflectivity of the reflection film to light with a wavelength of 500 nm is greater than or equal to 70%.

8. The organic light-emitting structure according to claim 5, wherein at least one of the first light-emitting unit, the second light-emitting unit, the third light-emitting unit, and the fourth light-emitting unit further comprises a light extraction layer, the light extraction layer covers one side of the translucent electrode away from the organic laminated body; and a refractive index of the light extraction layer to light with a wavelength of 500 nm is greater than 1.85.

9. The organic light-emitting structure according to claim 1, wherein a material of a light-emitting layer of the phosphorescent light-emitting unit is iridium compound or platinum compound.

10. A display device, comprising an organic light-emitting structure, wherein the organic light-emitting structure comprises:
    a first light-emitting unit,
    a second light-emitting unit,
    a third light-emitting unit, and
    a fourth light-emitting unit,
    wherein each of the first light-emitting unit, the second light-emitting unit, the third light-emitting unit, and the fourth light-emitting unit comprises a first electrode, a second electrode, and an organic laminated body placed between the first electrode and the second electrode; one of the first electrode and the second electrode is a translucent electrode; and the organic laminated body comprises a light-emitting layer; and at least one of the first light-emitting unit, the second light-emitting unit, the third light-emitting unit, and the fourth light-emitting unit is a fluorescent light-emitting unit, wherein an emission wavelength of the first light-emitting unit, an emission wavelength of the second light-emitting unit, an emission wavelength of the third light-emitting unit, and an emission wavelength of the fourth light-emitting unit successively increase, a thickness of the first light-emitting layer is in a range of 18 nm-22 nm, a thickness of the second light-emitting layer is in a range of 31.5 nm-38.5 nm, a thickness of the third light-emitting layer is in a range of 31.5 nm-38.5 nm, and a thickness of the fourth light-emitting layer is in a range of 36 nm-44 nm, the organic laminated body further comprises a monochromic hole transmission layer stacked with the light-emitting layer, the light-emitting layer is closer to the translucent electrode than the monochromic hole transmission layer is;

the monochromic hole transmission layer of the first light-emitting unit is a first monochromic hole transmission layer, the monochromic hole transmission layer of the second light-emitting unit is a second monochromic hole transmission layer, the monochromic hole transmission layer of the third light-emitting unit is a third monochromic hole transmission layer, and the monochromic hole transmission layer of the fourth light-emitting unit is a fourth monochromic hole transmission layer; and the first monochromic hole transmission layer, the second monochromic hole transmission layer, the third monochromic hole transmission layer and the fourth monochromic hole transmission layer are made of different electron-resistant materials;

a thickness of the first monochromic hole transmission layer is in a range of 9 nm-11 nm, a thickness of the second monochromic hole transmission layer is in a range of 27 nm-33 nm, a thickness of the third monochromic hole transmission layer is in a range of 45 nm-55 nm, and a thickness of the fourth monochromic hole transmission layer is in a range of 63 nm-77 nm, and the organic laminated body further comprises a common hole transmission layer, the common hole transmission layer is stacked on one side of the monochromic hole transmission layer away from the light-emitting layer, and the common hole transmission layer and the monochromic hole transmission layer are made of different materials.

11. The organic light-emitting structure according to claim 1, wherein the at least one of the first light-emitting unit, the second light-emitting unit, the third light-emitting unit, and the fourth light-emitting unit is the fluorescent light-emitting unit, and each of the rest of the first light-emitting unit, the second light-emitting unit, the third light-emitting unit, and the fourth light-emitting unit is a phosphorescent light-emitting unit.

12. The organic light-emitting structure according to claim 1, wherein the first light-emitting unit is a blue-light emitting unit; the second light-emitting unit is a green-light emitting unit; the third light-emitting unit is a yellow-light emitting unit; and the fourth light-emitting unit is a red-light emitting unit.

13. The organic light-emitting structure according to claim 12, wherein the first light-emitting unit is a fluorescent light-emitting unit.

14. The organic light-emitting structure according to claim 13, wherein each of the second light-emitting unit, the third light-emitting unit, and the fourth light-emitting unit is a phosphorescent light-emitting unit.

* * * * *